(12) United States Patent
Chen et al.

(10) Patent No.: US 6,275,421 B1
(45) Date of Patent: Aug. 14, 2001

(54) CHIP ENABLE INPUT BUFFER

(75) Inventors: Tien-Min Chen, San Jose; Kazuhiro Kurihara, Sunnyvale, both of CA (US)

(73) Assignees: Advanced Micro Devices, Inc, Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/661,358

(22) Filed: Sep. 14, 2000

Related U.S. Application Data

(60) Provisional application No. 60/199,481, filed on Apr. 25, 2000.

(51) Int. Cl.[7] .................................................. G11C 7/00
(52) U.S. Cl. ...................................... 365/189.06; 365/226
(58) Field of Search ......................... 365/189.05, 189.06, 365/185.23, 226

(56) References Cited

U.S. PATENT DOCUMENTS

| | | | |
|---|---|---|---|
| 5,040,151 | * 8/1991 | Miyawaki et al. | 365/226 |
| 5,224,072 | 6/1993 | Matsubara | 365/189.05 |
| 5,500,614 | 3/1996 | Egawa | 327/107 |
| 5,638,328 | * 6/1997 | Cho | 365/189.05 |
| 5,699,301 | 12/1997 | Egawa | 365/189.05 |
| 5,822,257 | * 10/1998 | Ogawa | 365/189.05 |
| 5,877,989 | 3/1999 | Egawa | 365/189.05 |

* cited by examiner

*Primary Examiner*—Tan T. Nguyen
(74) *Attorney, Agent, or Firm*—Wagner, Murabito & Hao LLP

(57) ABSTRACT

A memory device is disclosed that is operable with a supply voltage (Vcc) within an electronic system. The memory device is selected or placed in a standby mode by electric signals from the electronic system. The memory device includes an external voltage buffer circuit for buffering the electric signals that are generated by the electronic system using an external supply voltage. The external voltage buffer circuit includes a clamping circuit and an activation circuit. The clamping circuit generates a clamped signal with the external supply voltage and the supply voltage (Vcc). The activation circuit is responsive to the clamped signal and the electric signals and generates an output signal with the supply voltage (Vcc). The external voltage buffer circuit maintains low standby current during the standby mode since it operates with both the supply voltage (Vcc) and the external supply voltage.

20 Claims, 2 Drawing Sheets

CHIP ENABLE INPUT BUFFER

This application claims the benefit under 35 U.S.C. §119(e) of Provisional U.S. patent application Ser. No. 60/199,481, filed on Apr. 25, 2000.

FIELD OF THE INVENTION

The present invention relates generally to non-volatile memory devices and, more particularly, to a method and system for providing input voltage buffering in a flash electrically erasable programmable memory ("EEPROM").

BACKGROUND OF THE INVENTION

Computers, personal digital assistants, cellular telephones and other electronic systems and devices typically include processors and memory. The memory is used to store instructions (typically in the form of computer programs) to be executed and/or data to be operated on by the processors to achieve the functionality of the device. Some applications require retention of the instructions and/or data in a permanent or non-volatile storage medium. Such memories maintain information when the device is turned off or power is removed. Exemplary applications include computer Basic Input Output Systems (BIOS) storage and diskless handheld computing devices, such as personal digital assistants.

Flash memories store information in the absence of continuous power and are capable of being constructed in a very compact form. Flash memory is typically constructed by fabricating a plurality of floating gate transistors in a silicon substrate to form a core cell area. A floating gate transistor is capable of storing electrical charge on a separate gate electrode, known as a floating gate, that is separated by a dielectric layer from a control gate electrode. Generally, stored electrical charge in the floating gate represents a data state.

Flash memory devices also include a periphery area in the silicon substrate. Logic and addressing functions are performed by a plurality of logic and addressing circuits in the periphery area. The logic and addressing circuits perform internal logic operations such as reading, programming and erasing the stored charge in the floating gate transistors.

Flash memory devices also use a supply voltage (Vcc). The supply voltage (Vcc) is generated by a fixed voltage power supply that is used to power the internal logic operations.

The flash memory is electrically interfaced with a system processor of an electronic system or device. When the operation of the flash memory is desired by the electronic system or device, the flash memory is selected with a chip enable signal. When selected by the typically logic low (logic "0") chip enable signal, the flash memory's logic and addressing circuitry is activated such that the flash memory can be operated by the electronic system or device.

When the flash memory is deselected by the chip enable signal that is typically logic high (logic "1"), it is in a standby mode. The standby mode decreases the power consumption of the flash memory because less of the logic and addressing circuitry is activated. It is desirable to have a low standby current draw to maintain the lowest possible power consumption of the flash memory during standby mode.

Typically, the supply voltage (Vcc) originates from the same supply voltage that powers the electronic system or device. As such, the chip enable signal is generated by the electronic system or device using the supply voltage (Vcc). In some cases, the electronic system or device is powered from another power supply source that is used to generate the chip enable signal.

A problem occurs when the electronic system generates the chip enable signal at voltage levels that are lower than the supply voltage (Vcc). When the voltage level of the chip enable signal that is logic high is less than the supply voltage (Vcc), the logic circuit within the flash memory that receives the chip enable signal may not operate properly. Since the logic circuit is operated with the supply voltage (Vcc), the chip enable signal used to deselect the flash memory may not be capable of completely deactivating the logic circuit. As such, when the flash memory is deselected and enters the standby mode, leakage current may occur that increases the standby current and the flash memory will consume more power.

SUMMARY

The presently preferred embodiments are capable of being placed in a standby mode by a logic high chip enable signal with a voltage level that is less than the magnitude of the supply voltage (Vcc) without causing increased standby current. In addition, the presently preferred embodiments maintain the standby current at desirably low levels when the external supply voltage is greater than the supply voltage (Vcc).

The present invention discloses a memory device that is operable with a supply voltage (Vcc). In the presently preferred embodiment, the memory device is a flash memory. The flash memory is controlled with electric signals generated with an external supply voltage by an electronic system. The flash memory comprises a plurality of logic circuits that are electrically connected with the supply voltage (Vcc). In addition, the flash memory includes an external voltage buffer circuit.

The presently preferred external voltage buffer circuit includes a clamping circuit and an activation circuit. The clamping circuit is electrically connected with the supply voltage (Vcc), the external supply voltage and the activation circuit. The activation circuit is electrically connected with the electronic system and the logic circuits. The clamping circuit generates a clamped signal that is received by the activation circuit. The activation circuit receives the clamped signal and generates an output signal when activated by the electric signals. The output signal controls activation of the logic circuits.

Another embodiment of the present invention discloses a method of buffering electric signals with a memory device. The method comprises the acts of providing a supply voltage (Vcc) and an external supply voltage that are received by a clamping circuit. The clamping circuit generates a clamped signal with the supply voltage (Vcc) and the external supply voltage. The clamped signal is received by an activation circuit. Electric signals are generated with the external supply voltage to direct the activation circuit to generate an output signal.

Power consumption of the flash memory during the standby mode is maintained at desirably low levels by deactivating the activation circuit with the electric signal that is the logic high chip enable signal. The activation circuit is deactivated since it operates with the voltage level of the clamped signal. The voltage level of the clamped signal is controlled to be about equal to the supply voltage (Vcc) or the external supply voltage. Since the difference in the voltage level of the logic high chip enable signal and the operating voltage level of the activation circuit is controlled, low levels of standby current during the standby mode are maintained to keep power consumption at desirable low levels.

These and other features and advantages of the invention will become apparent upon consideration of the following detailed description of the presently preferred embodiments of the invention, viewed in conjunction with the appended drawings.

DETAILED DESCRIPTION OF THE PRESENTLY PREFERRED EMBODIMENTS

The exemplary embodiments of the invention are set forth below with reference to specific configurations. Various changes and modifications could be made to the specific configurations while remaining within the scope of the claims. The invention may be used with any type of memory device that is selected and de-selected by electric signals generated with an external voltage; however, the illustrated embodiment of the invention is designed for a flash memory. Although the illustrated embodiment of the invention uses a supply voltage (Vcc) that is nominally 3.0 V, those skilled in the art would recognize that other supply voltage levels may be used.

Figure 1:
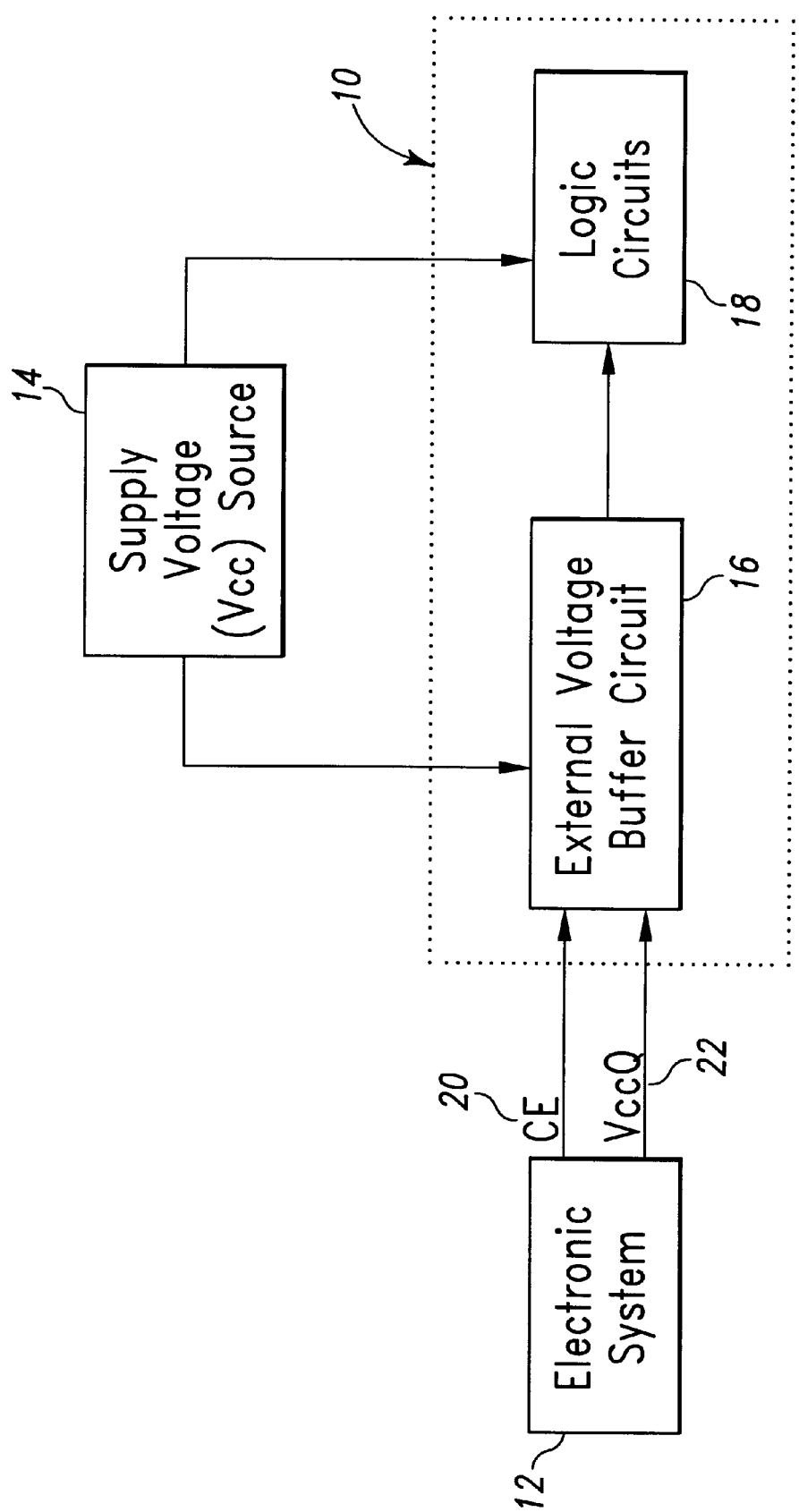
FIG. 1 illustrates a block diagram of an electronic system, a portion of a flash memory constructed in accordance with the present invention and a supply voltage (Vcc).

FIG. 1 illustrates a portion of a flash memory 10 that includes one embodiment of the present invention. The flash memory 10 is electrically connected with an electronic system 12 and a supply voltage (Vcc) source 14. The presently preferred flash memory 10 includes an external voltage buffer circuit 16 that is electrically connected with a plurality of logic circuits 18. The external voltage buffer circuit 16 and the logic circuits 18 are electrically connected with the supply voltage (Vcc) source 14. Although not illustrated, a plurality of electrical connections provide an interface of the flash memory 10 with the electronic system 12. The electrical connections that are most relevant to the illustrated embodiment of the present invention are a chip enable line (CE) 20 and an external voltage line (VccQ) 22 that electrically connect the electronic system 12 with the external voltage buffer circuit 16 as illustrated in FIG. 1.

The electronic system 12 generally represents a device that uses the flash memory 10 for memory applications such as, for example, data accumulation, data/lookup table storage, embedded code storage and file storage. The electronic system 12 can be, for example, a flight recorder, a laser printer, a cellular phone, a computer or any other such devices that include electronics that require memory. Typically included in the electronic system 12 is a system processor (not shown) such as, for example, a microprocessor, logic circuits or similar control mechanism that is used to operate the electronic system 12, and to generate a plurality of electric signals to direct the operation of the flash memory 10. In general, the electric signals supply addressing, data and logic to direct the logic circuits 18 in the flash memory 10 to perform internal logic operations such as programming, erasing and reading to support the operation of the electronic system 12.

The presently preferred flash memory 10 is operated with the supply voltage (Vcc) source 14. The supply voltage (Vcc) source 14 is an unregulated, fixed power supply that generates a supply voltage (Vcc) that can typically vary from about 2.7 to 3.6 V. The supply voltage (Vcc) source 14 could be formed from a variety of readily available, widely known power supplies. The electronic system 12 can be operated with the supply voltage (Vcc) or it can be operated with an external supply voltage. The present invention relates to the situation where the electronic system 12 is operated with an external supply voltage (not shown) that is electrically connected with the system processor and is part of the electronic system 12. In the presently preferred embodiment, the external supply voltage can be in a range between about 1.8 V and 5.5 V and is determined based on the requirements of the electronic system 12.

During operation of the electronic system 12, it is desirable to limit the amount of power consumed by the flash memory 10 when the flash memory 10 is not being operated by the electronic system 12. When operation of the flash memory 10 is desired, the flash memory 10 is selected by the electronic system 12. The selection of the flash memory 10 is accomplished by a logic low (logic "0") electric signal, referred to hereafter as a logic low chip enable signal. The logic low chip enable signal is generated by the electronic system 12 with the system processor using the external supply voltage. The logic low chip enable signal is directed to the external voltage buffer circuit 16 on the chip enable line (CE) 20. In addition, the external supply voltage is supplied by the electronic system 12 to the external voltage buffer circuit 16 on the external voltage line (VccQ) 22. The external voltage buffer circuit 16 is activated by the logic low chip enable signal to generate an output signal that is logic low (logic "0") to activate the logic circuits 18.

When the logic low chip enable signal is not asserted by the electronic system 12, the flash memory 10 is in a power saving "sleep mode" referred to as a standby mode. During the standby mode, the flash memory 10 draws a standby current from the supply voltage (Vcc) and the external supply voltage that is lower than the current consumed by the flash memory 10 when it is selected. The standby current is maintained at low levels by the deactivation of the logic circuits 18 with the external voltage buffer circuit 16.

The flash memory 10 is directed by the electronic system 12 to enter the standby mode by a logic high (logic "1") electric signal, hereafter referred to as a logic high chip enable signal. The logic high chip enable signal is generated with the external supply voltage on the chip enable line (CE) 20. The voltage level of the logic high chip enable signal can be either a TTL logic high voltage level or a CMOS logic high voltage level. In the presently preferred embodiments, the TTL logic high voltage level is about 2.0V and the CMOS logic high voltage level is about seventy percent of the external supply voltage.

In the presently preferred embodiments, the logic high chip enable signal activates the external voltage buffer circuit 16 to generate an output signal to deactivate the logic circuits 18. The output signal is generated with the supply voltage (Vcc). Therefore the logic high chip enable signal from the electronic system 12 is buffered from the logic circuits 18. In addition, the external voltage buffer circuit 16 maintains low levels of standby current on the chip enable line (CE) 20 when deactivated by either the TTL or the CMOS logic high voltage level. In the presently preferred embodiments, the low levels of standby current for the logic high chip enable signal at the TTL or CMOS logic high voltage levels are less than or equal to 250 micro amps or less than or equal to 5 micro amps, respectively.

The external voltage buffer circuit 16 maintains low levels of standby current on the chip enable line (CE) 20 by selectively operating with either the supply voltage (Vcc) or the external supply voltage when deactivated by the logic high chip enable signal. Selective operation of the external voltage buffer circuit 16 controls the difference between the voltage levels of the logic high chip enable signal and the operating voltage level of the external voltage buffer circuit 16. Control of the difference between the voltage levels allows deactivation of the external voltage buffer circuit 16 by the logic high chip enable signal that maintains low power consumption during the standby mode.

The foregoing provides an illustrative overview of the operation of the presently preferred flash memory 10 within the electronic system 12. The illustrated embodiment of the external voltage buffer circuit 16 allows the flash memory 10 to maintain low standby current when directed to enter the standby mode by a logic high chip enable signal with either a TTL or CMOS logic high voltage level. The presently preferred embodiment has been illustratively set forth with respect to buffering the chip enable signal. Those skilled in the art would recognize that the present invention could generally be applied to electric signals where low power consumption voltage buffering is desired. Accordingly, the presently preferred embodiments set forth should not be construed as a limitation on the present invention.

Figure 2:
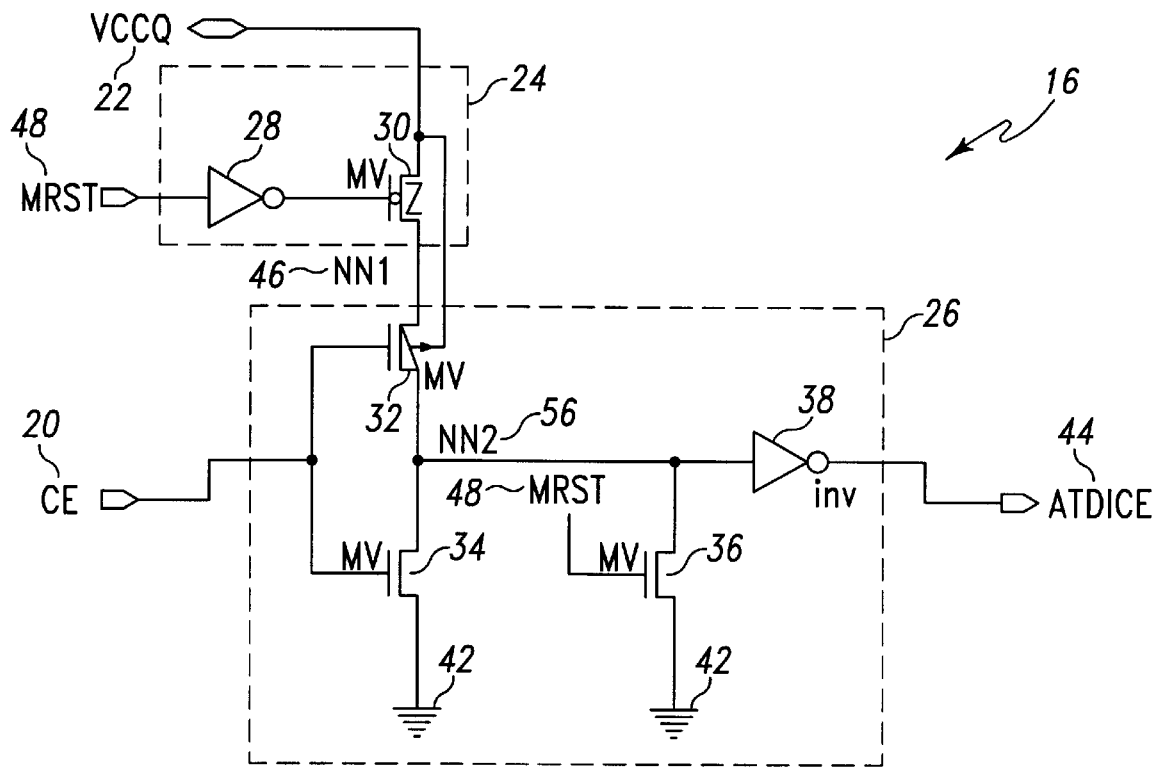
FIG. 2 is a circuit schematic of a presently preferred external voltage buffer circuit illustrated in FIG. 1.

FIG. 2 illustrates a circuit schematic of the presently preferred external voltage buffer circuit 16. The external voltage buffer circuit 16 includes a clamping circuit 24 and an activation circuit 26. The presently preferred clamping circuit 24 includes a first inverter 28 and a z device n-channel transistor 30 that are electrically connected as illustrated. The presently preferred activation circuit 26 includes a p-channel transistor 32, a plurality of n-channel transistors 34, 36 and a second inverter 38 that are electrically connected as illustrated. The clamping circuit 24 and the activation circuit 26 are electrically connected with the electronic system 12, illustrated in FIG. 1, by the external voltage line (VccQ) 22 and the chip enable line (CE) 20, respectively. The activation circuit 26 is also electrically connected with a ground connection 42. Although not illustrated, the activation circuit 26 is also electrically connected with the logic circuits 18, illustrated in FIG. 1, by an address transition detection line (ATDICE) 44.

The clamping circuit 24 generates a clamped signal on a first node (NN1) 46. The clamped signal is generated using z-device n-channel transistor 30. The external supply voltage is supplied to the drain of z-device n-channel transistor 30 on the external voltage line (VccQ) 22. The control gate of z-device n-channel transistor 30 is electrically connected with first inverter 28. First inverter 28 is in turn electrically connected with a manual reset line (MRST) 48, as illustrated in FIG. 2. The manual reset line (MRST) 48 conducts (logic "1") during a hardware reset operation that forces the flash memory 10 out of any mode that is currently executing. Accordingly, the manual reset line (MRST) 48 remains logic low (logic "0") during operation of the external voltage buffer circuit 16.

Figure 3:
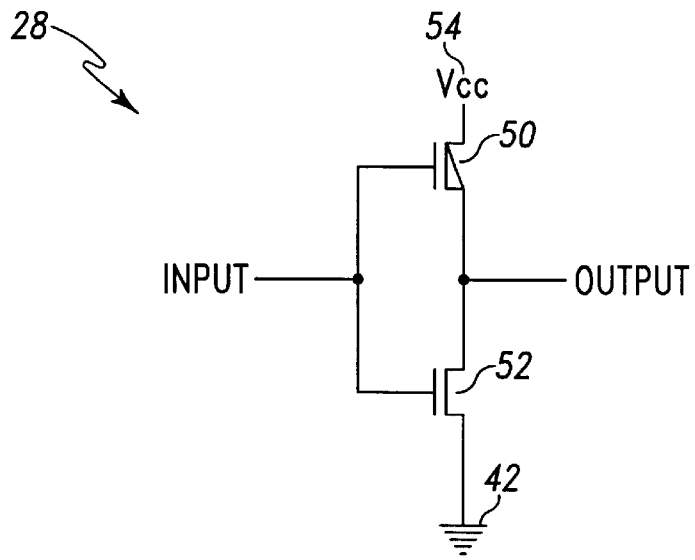
FIG. 3 is a circuit schematic of a presently preferred inverter illustrated in FIG. 2.

FIG. 3 illustrates the presently preferred first inverter 28. First inverter 28 includes a p-channel transistor 50 and an n-channel transistor 52 that are electrically connected as illustrated. In addition, the sources of p-channel transistor 50 and n-channel transistor 52 are electrically connected to a supply voltage (Vcc) line 54 and the ground connection 42, respectively. As known in the art, the output of first inverter 28 is determined based on the voltage level of electric signals received at its input. First inverter 28 has an operating threshold such that voltage levels at its input that are greater than the operating threshold (i.e. logic high) will cause an output of about zero volts (i.e. logic low). The output will be about zero volts since n-channel transistor 52 is activated to electrically connect the output with the ground connection 42 and p-channel transistor 50 is deactivated.

Similarly, when the voltage levels at the input of first inverter 28 are less than the operating threshold (i.e. logic low), p-channel transistor 50 is activated to pass voltage on the 15 supply voltage (Vcc) line 54 to the output and n-channel transistor 52 is deactivated. The voltage present on the supply voltage (Vcc) line 54 is the supply voltage (Vcc). Therefore the voltage passed by p-channel transistor 50 to the output of inverter 28 is about equal to the supply voltage (Vcc) (i.e. logic high).

Referring again to FIG. 2, z-device n-channel transistor 30 is controlled by the output 20 of first inverter 28. The presently preferred z-device n-channel transistor 30 is a low-threshold z-transistor that is formed to have a threshold voltage of about zero volts. The threshold voltage of a transistor is the magnitude of voltage that is applied between the control gate and the source to activate the transistor. The threshold voltage of z-device n-channel transistor 30 may be controlled in any suitable fashion, such as by providing an appropriate threshold voltage implant in the channel of z-device n-channel transistor 30. When activated, z-device n-channel transistor 30 generates the clamped signal on the first node (NN1) 46 at a voltage level that is approximately equal to the external supply voltage or the supply voltage (Vcc), whichever is lower.

Activation of z-device n-channel transistor 30 occurs when the output of first inverter 28 is about equal to the supply voltage (Vcc) (i.e. logic high). When activated, z-device n-channel transistor 30 allows current flow from the external supply voltage on the external voltage line (VccQ) 22 to the first node (NN1) 46. Z-device n-channel transistor 30 does not actually generate the clamped signal on the first node (NN1) 46. Rather, z-device n-channel transistor 30 creates the voltage level of the clamped signal on the first node (NN1) 46 by providing a voltage dropping resistance of a portion of the external supply voltage. The magnitude of the voltages at the control gate and the drain of z-device n-channel transistor 30 determines the level of activation and thus the voltage drop across z-device n-channel transistor 30. Accordingly, the voltage level on the first node (NN1) 46 is approximately equal to the supply voltage (Vcc), until the voltage level at the control gate of z-device n-channel transistor 30 exceeds the magnitude of the external supply voltage at the drain of z-device n-channel transistor 30. Once this occurs, z-device n-channel transistor 30 will generate a voltage level on the first node (NN1) 46 that is approximately equal to the external supply voltage at the drain of z-device n-channel transistor 30.

The activation circuit 26 receives the clamped signal from the first node (NN1) 46 at the source of p-channel transistor 32 that is electrically connected with the first node (NN1) 46 as illustrated in FIG. 2. The well of p-channel transistor 32 is electrically connected to the external voltage line (VccQ) 22 to avoid forward bias conditions during operation. As known in the art, forward bias conditions can activate diodes within p-channel transistor 32 such that a leakage current can occur that may compromise reliable operation. The control gate of p-channel transistor 32 is electrically connected with the chip enable line (CE) 20 such that p-channel transistor 32 is controlled by the electric signals present on the chip enable line (CE) 20. As known in the art, activation and deactivation of p-channel transistor 32 is dependent on the voltage level between the source and the control gate of p-channel transistor 32.

In the presently preferred embodiment, the voltage level at the source of p-channel transistor 32 is controlled such that the voltage levels applied to the control gate of p-channel transistor 32 will activate or deactivate p-channel transistor 32. Deactivation of p-channel transistor 32 is by the logic high chip enable signal on the chip enable line (CE) 20 during the standby mode. Controlling the voltage level of the clamped signal at the source of p-channel transistor 32, maintains the low levels of standby current during the standby mode on the control enable line (CE) 20 when p-channel transistor 32 is deactivated.

When activated, p-channel transistor 32 will pass the clamped signal to a second node (NN2) 56. The second node (NN2) 56 is electrically connected with the drain of p-channel transistor 32, the drain of n-channel transistor 34, the drain of n-channel transistor 36 and second inverter 38 as illustrated in FIG. 2. Similar to p-channel transistor 32, n-channel transistor 34 is controlled by electric signals on the chip enable line (CE) 20. In addition, n-channel transistor 36 remains deactivated by the manual reset line (MRST) 48 that remains logic low (logic "0"), as previously set forth. The clamped signal present on the second node (NN2) 56 is provided as an input to second inverter 38.

Second inverter 38 inverts electric signals received at its input similar to the previously set forth first inverter 28. As such, second inverter 38 provides either a logic high (logic "1") electric signal that is approximately equal to the supply voltage (Vcc) or a logic low (logic "0") electric signal on the address transition detection line (ATDICE) 44. The electric signal is generated based on the voltage level present on the second node (NN2) 56.

In another presently preferred embodiment, the second inverter 38 is a ratioed inverter. Referring again to FIG. 3, a ratioed inverter is formed with a p-channel transistor 50 that has a relatively high resistance when activated and an n-channel transistor 52 that has a relatively low resistance when activated. As such, when the ratioed inverter has voltage levels at its input that are greater than the operating threshold, n-channel transistor 52 will be activated to electrically connect the output to the ground connection 42. However, in the case where the voltage level present on the input of the ratioed inverter is less than the supply voltage (Vcc), p-channel transistor 50 will not be completely deactivated and will therefore leak current, known as cross-bar current, to the ground connection 42. The relatively high resistance of p-channel transistor 50 of the present preferred embodiment will limit this cross-bar current thereby minimizing power consumption.

The operation of the presently preferred embodiment will now be explained in detail using FIGS. 1, 2 and 3. Referring again to FIG. 1, during operation, the electronic system 12 selects the flash memory 10 by asserting the logic low chip enable signal on the chip enable line (CE) 20. The logic low chip enable signal activates the external voltage buffer circuit 16 to generate an output signal to the logic circuits 18 thereby activating the flash memory 10 to be directed by the electronic system 12 as previously set forth.

Referring again to FIG. 2, prior to the receipt of the logic low chip enable signal, the clamping circuit 24 of the external voltage buffer circuit 16 has received the external supply voltage and the supply voltage (Vcc) and has generated the clamped signal on the first node (NN1) 46. The voltage level of the clamped signal is approximately equal to the external supply voltage on the external voltage line (VccQ) 22 when the external supply voltage is less than the supply voltage (Vcc). Conversely, the voltage level of the clamped signal is approximately equal to the supply voltage (Vcc) when the external supply voltage is greater than the supply voltage (Vcc).

When the electronic system 12 asserts the logic low chip enable signal to select the flash memory 10, p-channel transistor 32 in the activation circuit 26 is activated to pass the clamped signal to the second node (NN2) 56. Second inverter 38 senses the voltage level of the clamped signal on its input and outputs a logic low (logic "0") electric signal on the address transition detection line (ATDICE) 44. The logic low electric signal on the address transition detection line (ATDICE) 44 activates the logic circuits 18 to enable the flash memory 10 to be directed by the electronic system 12 to perform internal logic operations such as reading, programming or erasing.

It should be noted that for the case where the external supply voltage is less than the supply voltage (Vcc), the input of second inverter 38 is about equal to the external supply voltage. If the ratioed inverter is used for second inverter 38, as set forth previously in one preferred embodiment, cross-bar current flow from the supply voltage (Vcc) to the ground connection 42 will be limited during activation of the logic circuits 18.

When the electronic system 12 no longer requires the operation of the flash memory 10, the logic high chip enable signal is directed to the flash memory 10 on the chip enable line (CE) 20 to conserve power. The voltage level of the logic high chip enable signal is either the TTL or CMOS logic high voltage level and deactivates p-channel transistor 32 and activates n-channel transistor 34 of the activation circuit 26. P-channel transistor 32 is deactivated since the voltage level of the clamped signal is controlled to be approximately equal to the supply voltage (Vcc) or the external supply voltage.

The activation of n-channel transistor 34 electrically connects the second node (NN2) 56 with the ground connection 42. As such, the input to second inverter 38 is a logic low (logic "0") electric signal and second inverter 3-8 generates a logic high (logic "1") electric signal at its output. The logic high electric signal is approximately equal to the supply voltage (Vcc) as previously set forth, and therefore deactivates the logic circuits 18 illustrated in FIG. 1.

For the case where the voltage level of external supply voltage is less than the supply voltage (Vcc), the clamped signal on the first node (N1) 46 is about equal to the external supply voltage. In this case, the logic high chip enable signal, whether at the TTL or CMOS logic high voltage level, deactivates p-channel transistor 32. P-channel transistor 32 is deactivated since the source of p-channel transistor 32 is about equal to the external supply voltage. Deactivation of p-channel transistor 32 maintains the low levels of standby current on the control enable line (CE) 20 during the standby mode. If the voltage level of the clamped signal was about equal to the supply voltage (Vcc), p-channel transistor 32 would leak cross-bar current to the ground connection 42 through n-channel transistor 34 thereby undesirably increasing the standby current on the control enable line (CE) 20.

For the case where the voltage level of external supply voltage is greater than the supply voltage (Vcc), the clamped voltage supplied to the first node (N1) 46 is about equal to the supply voltage (Vcc). When the flash memory 10 is directed to enter the standby mode, the logic high chip enable signal is generated, for example, at the TTL logic level of 2V. In this example, the external voltage buffer circuit 16 maintains the standby current when the external supply voltage is greater than the supply voltage (Vcc). The standby current is maintained since the clamped signal provides the supply voltage (Vcc) to the source of p-channel transistor 32. As such, p-channel transistor 32 is deactivated by the logic high chip enable signal and maintains the low levels of standby current. If the voltage level of the clamped signal was about equal to the external supply voltage, the standby current consumed by the flash memory 10 would undesirably increase with voltage levels of the external supply voltage above the supply voltage (Vcc).

The presently preferred embodiments of the external voltage buffer circuit 16 can maintain the low levels of standby current on the chip enable line (CE) 20 when different voltage levels of the external supply voltage are used. The external voltage buffer circuit 16 is capable of being deactivated and maintains the low levels of standby current during the standby mode. The external voltage buffer circuit 16 is deactivated by the logic high chip enable signal at a voltage level of the TTL or CMOS logic high voltage level by controlling the voltage level at the first node (N1) 46. The flash memory 10 is therefore capable of interfacing with electronic systems 12 operating at different external supply voltage levels that supply the logic high chip enable signal at either the TTL or CMOS logic high voltage level while maintaining the low levels of standby current during the standby mode.

While the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A memory device that is operable with a supply voltage (Vcc) for buffering electric signals generated with an external supply voltage, comprising:
   a clamping circuit electrically connected with said supply voltage (Vcc) and said external supply voltage for generating a clamped signal; and
   an activation circuit electrically connected with said clamping circuit for receiving said clamped signal and generating an output signal when directed by said electric signals.

2. The memory device of claim 1, wherein said activation circuit includes a ratioed inverter to limit power consumption.

3. The memory device of claim 1, wherein said clamped signal is about equal to said supply voltage (Vcc) when said supply voltage (Vcc) is less than said external supply voltage.

4. The memory device of claim 1, wherein said clamped signal is about equal to said external supply voltage when said external supply voltage is less than said supply voltage (Vcc).

5. The memory device of claim 1, wherein said memory device is a flash memory.

6. A memory device that is operable with a supply voltage (Vcc) and is controlled with electric signals generated with an external supply voltage by an electronic system, said memory device comprising:
   a plurality of logic circuits electrically connected with said supply voltage (Vcc); and
   an external voltage buffer circuit comprising:
      a clamping circuit electrically connected with said supply voltage (Vcc) and said external supply voltage for generating a clamped signal; and
      an activation circuit electrically connected with said clamping circuit, said electronic system and said plurality of logic circuits for receiving said clamped signal and generating an output signal to control activation of said plurality of logic circuits when directed by said electric signals.

7. The memory device of claim 6, wherein said plurality of logic circuits are activated by said output signal when said memory device is selected.

8. The memory device of claim 6, wherein said plurality of logic circuits are deactivated by said output signal to place said memory device in a standby mode.

9. The memory device of claim 6, wherein said clamped signal is about equal to said supply voltage (Vcc) when said supply voltage (Vcc) is less than said external supply voltage.

10. The memory device of claim 6, wherein said clamped signal is about equal to said external supply voltage when said external supply voltage is less than said supply voltage (Vcc).

11. The memory device of claim 6, wherein said activation circuit includes a ratioed inverter to limit power consumption.

12. The memory device of claim 6, wherein said memory device is a flash memory.

13. The memory device of claim 6, wherein said electric signals are a logic low chip enable signal and a logic high chip enable signal.

14. A method of buffering of electric signals with a memory device, comprising the acts of:
   providing a supply voltage (Vcc);
   providing an external supply voltage;
   generating a clamped signal with a clamping circuit, said supply voltage (Vcc) and said external supply voltage;
   generating said electric signals with said external supply voltage; and
   directing an activation circuit with said electric signals and said clamped signal to generate an output signal.

15. The method of claim 14 comprising the further act of activating a plurality of logic circuits with said output signal when said memory device is selected.

16. The method of claim 14, comprising the further act of deactivating a plurality of logic circuits with said output signal when said memory device is in a standby mode.

17. The method of claim 14, wherein said activation circuit includes a ratioed inverter to limit power consumption.

18. The method of claim 14, wherein said clamped signal is about equal to said supply voltage (Vcc) when said supply voltage (Vcc) is less than said external supply voltage.

19. The method of claim 14, wherein said clamped signal is about equal to said external supply voltage when said external supply voltage is less than said supply voltage (Vcc).

20. The method of claim 14, wherein said memory device is a flash memory.

* * * * *